(12) United States Patent
Kimura et al.

(10) Patent No.: US 7,355,327 B2
(45) Date of Patent: Apr. 8, 2008

(54) LAMINATED PIEZOELECTRIC/ELECTROSTRICTIVE ELEMENT

(75) Inventors: Koji Kimura, Nagoya (JP); Kazumasa Kitamura, Nagoya (JP); Tatsuo Kawaguchi, Nagoya (JP)

(73) Assignee: NGK Insulators, Ltd., Nagoya (JP)

( * ) Notice: Subject to any disclaimer, the term of this patent is extended or adjusted under 35 U.S.C. 154(b) by 0 days.

(21) Appl. No.: 11/444,628

(22) Filed: Jun. 1, 2006

(65) Prior Publication Data

US 2006/0279173 A1 Dec. 14, 2006

(30) Foreign Application Priority Data

Jun. 10, 2005 (JP) .............................. 2005-170399
May 12, 2006 (JP) .............................. 2006-133625

(51) Int. Cl.
*H01L 41/083* (2006.01)
(52) U.S. Cl. ...................... 310/366; 310/328; 310/367
(58) Field of Classification Search ................ 310/328, 310/366, 367
See application file for complete search history.

(56) References Cited

U.S. PATENT DOCUMENTS

| | | | | |
|---|---|---|---|---|
| 3,281,613 | A * | 10/1966 | Hatschek | ..................... 310/338 |
| 4,814,659 | A | 3/1989 | Sawada | |
| 5,070,486 | A * | 12/1991 | Boucher | ..................... 367/155 |
| 5,254,212 | A | 10/1993 | Someji et al. | |
| 5,410,208 | A * | 4/1995 | Walters et al. | ............... 310/334 |
| 7,274,134 | B2 * | 9/2007 | Ohmori et al. | ............. 310/366 |
| 2004/0178701 | A1 * | 9/2004 | Sato et al. | ................... 310/328 |
| 2005/0264138 | A1 * | 12/2005 | Ohmori et al. | ............. 310/328 |
| 2006/0138908 | A1 * | 6/2006 | Iwase et al. | ................ 310/366 |

FOREIGN PATENT DOCUMENTS

| | | |
|---|---|---|
| EP | 0 441 438 | 8/1991 |
| EP | 1 608 031 | 12/2005 |
| JP | 61-182284 | 8/1986 |
| JP | 06-291380 | * 10/1994 |
| JP | 2000-082852 | 3/2000 |
| JP | 2001-339105 | 12/2001 |
| JP | 2002-054527 | 2/2002 |
| JP | 2002-160195 | 6/2002 |

OTHER PUBLICATIONS

U.S. Appl. No. 11/138,250, filed May 26, 2005, Ohmori et al.

* cited by examiner

*Primary Examiner*—Thomas M. Dougherty
(74) *Attorney, Agent, or Firm*—Burr & Brown

(57) ABSTRACT

A laminated piezoelectric element is applicable as a driving source of opening and closing mechanism of an injection nozzle in a fuel injecting device. A laminated piezoelectric/electrostrictive element 1 has: a columnar laminate 10 constituted by alternately laminating a plurality of piezoelectric/electrostrictive layers 14 and inner electrode layers 18, 19; and outer electrodes connected to the inner electrode layers 18, 19 every other layer. This laminated piezoelectric/electrostrictive element 1 has stepped portions A formed periodically at every laminating cycle T in a side surface of the columnar laminate 10 of the element, the side surface being parallel to an axial direction (S-direction) of the columnar laminate 10. Due to the constitution mentioned above, the electrode is not easily worn even during an expanding and contracting operation during practical use, and the element can sufficiently circulate and cool a lubricant through the casing even during practical use.

10 Claims, 9 Drawing Sheets

(SECTIONAL SHAPE OF UPPER END PORTION OF COLUMNAR LAMINATE 30)

FIG.15
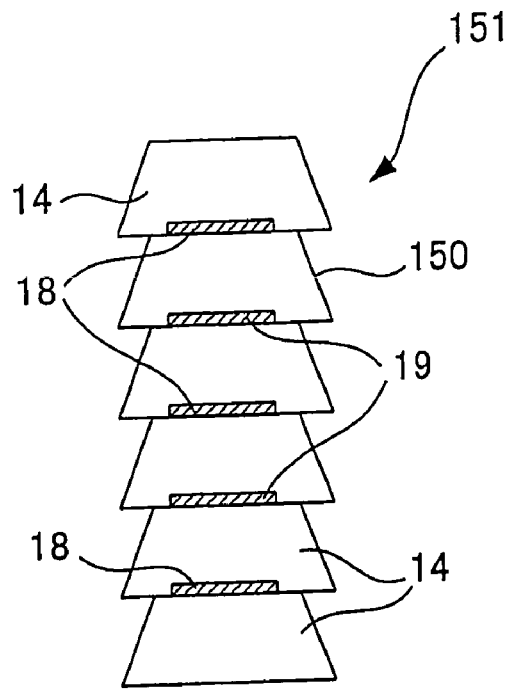
FIG.16(a)　　FIG.16(b)
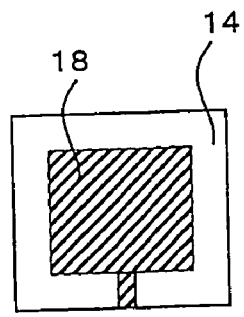 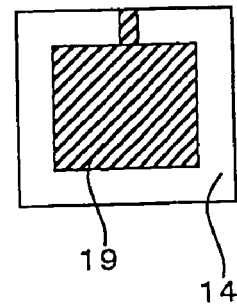

LAMINATED PIEZOELECTRIC/ELECTROSTRICTIVE ELEMENT

BACKGROUND OF THE INVENTION

1. Field of the Invention

The present invention relates to a piezoelectric/electrostrictive element in which an inner electrode layer is not easily worn and which has an excellent lubricant circulating or cooling property.

2. Description of the Related Art

To prevent global warming which is one of global environment problems, there has been developed a technology for reducing a fuel consumption of a car. As an environment-friendly power source of the car, a fuel cell is considered to be prevailing, but there are many technical and economical problems in realizing this power source. To solve the problems, a hybrid engine system used together with an electric motor is put to practical use. In addition, especially in Europe, there largely increases market share of a car having an improved diesel engine mounted thereon, in which emissions of deleterious substances have been reduced.

The diesel engine is an engine in which a fuel is injected to a cylinder and compressed at a high pressure to be self-ignited. Moreover, an engine output is controlled by a fuel injection amount. Therefore, in the diesel engine, a role of a fuel injecting device is important which feeds a fuel into the cylinder. In recent years, a reason why the diesel engine is increasingly used mainly lies in development of a so-called common rail type fuel injecting device. Especially, from now on, it is expected that adopting of a piezoelectric element instead of a solenoid promotes spreading of use of the diesel engine. Since the piezoelectric element can realize opening and closing of an injection nozzle at a higher speed as compared with the solenoid, it is possible to feed a more appropriate amount of fuel to the cylinder. An optimum combustion condition of the fuel can be formed. As a result, excellent effects are brought about: reduction of deleterious substances such as particulates, nitrogen oxide, carbon monoxide and hydrocarbon included in an exhaust gas; reduction of the fuel consumption; reduction of an engine noise; and improvement of an engine output.

The piezoelectric element to be applied to the fuel injecting device is utilized as a driving source of an injection nozzle opening and closing mechanism which generates a displacement or a stress. The element contained in a metal casing or the like is used in many cases. The piezoelectric element of a laminated type is usually applied. In general, this laminated piezoelectric element is prepared by: laminating the predetermined number of piezoelectric tapes in which patterns of a conductive material constituting an inner electrode are formed, and dividing this laminated green article into individual elements by processing such as cutting; or dividing a sintered block obtained by firing into individual elements by processing such as cutting. Therefore, the piezoelectric element has an outer flat surface formed by the processing. It is to be noted that as a prior document, JP-A-2001-339105 is cited.

Such conventional laminated piezoelectric element is contained in the casing as described above, and an expanding and contracting operation is performed in the casing. Therefore, an outer surface (side surface) of the piezoelectric element is slid. Therefore, needless to say, an end portion of the inner electrode exposed on the outer surface (side surface) of the piezoelectric element is ground by a friction with an inner surface of the casing. Thus, there has been a problem in reliability of a long-term operation. On the other hand, for a purpose of lubrication to inhibit such wearing phenomenon or a purpose of shutting out humidity of outside air, the piezoelectric element is sometimes contained together with the lubricant in the casing, and used. However, since the side surface of the piezoelectric element is flat, there is uncertainty around the lubricant or in cooling the lubricant and resultantly cooling the piezoelectric element. Therefore, the improvement of the reliability of the element has been required.

SUMMARY OF THE INVENTION

The present invention has been developed in view of the above-described problems of the conventional technology, and an object thereof is to realize a laminated piezoelectric element in which an electrode is not easily worn even during an expanding and contracting operation performed in a casing housing the element and which can sufficiently circulate and cool a lubricant even during use in the casing housing the element together with the lubricant, in a case where the element is applied as, for example, a driving source of an injection nozzle opening and closing mechanism in a fuel injecting device. As a result of intensive investigations, it has been found that the above object can be achieved by the following means.

That is, first in the present invention, there is provided a laminated piezoelectric/electrostrictive element comprising: a columnar laminate constituted by alternately laminating a plurality of piezoelectric/electrostrictive layers and inner electrode layers; and outer electrodes connected to the inner electrode layers every other layer, the element having a stepped portion every laminating period in a side surface of the columnar laminate of the element, the side surface being parallel to an axial direction of the columnar laminate. That is, the laminated piezoelectric/electrostrictive element of the present invention constitutes a structure having the stepped portions in the sectional shape thereof. The term "stepped portion" in the present specification hereinafter means such a constitution that each side surface (constituting the side surfaces) of the laminate element is overhanging.

In the laminated piezoelectric/electrostrictive element of the present invention, it is preferable that the laminating direction of the piezoelectric/electrostrictive layers and the inner electrode layers is the direction same to the axial direction of the columnar laminate (parallel direction to the axial direction). It is also preferable that the displacement generated by the piezoelectric/electrostrictive layer is a displacement based on a longitudinal effect of an electric field induced strain.

In the laminated piezoelectric/electrostrictive element of the present invention, it is preferable that a shape of a section of each piezoelectric/electrostrictive layer is a trapezoidal shape whose bottom line is parallel to the laminating direction of the layers, and the inner electrode layer is formed on the top surface of the piezoelectric/electrostrictive layer constituting the top (short side) of the trapezoidal shape. The trapezoidal shape described hereinafter means a graphical showing whose top is shorter than the bottom in the length, and the top side means a side which is shorter than the bottom side. The shape is not limited to the trapezoidal shape (the top is parallel to the bottom) in a geometrically defined strict meaning, however, it may be any trapezoidal like shape, as far as it can show an intended function within the scope of the present invention. The columnar laminate is constituted by alternately laminating a plurality of piezoelectric/electrostrictive layers and the inner electrode layers.

Therefore, when the piezoelectric/electrostrictive layers each having a trapezoidal sectional shape are laminated, the stepped portions are made on the side surface of the columnar laminate.

Moreover, it is preferable that the columnar laminate constituted by alternately laminating the plurality of piezoelectric/electrostrictive layers and inner electrode layers has a columnar shape or a pillar shape with chamfered side surface. Note that the term "pillar shape" may include any one of polygonal pillar shapes such as hexagonal pillar shape, octagonal pillar shape and the like in addition to square pillar shape in the present specification. The columnar shape or the pillar shape with chamfered side surface has a normal columnar shape or a normal pillar shape before the side surface thereof is chamfered, while the side surface thereof has the stepped portions in the present inventive element. The basic shape is the normal columnar or pillar shape, and whose side surface has been chamfered. In case of the pillar shape, especially in case of square pillar shape, its side surface is chamfered at the corner portions thereof. In each of the columnar shape and the pillar shape, the stepped portions are eliminated at the chamfered side surface, and are left on the portions which are not chamfered. In the laminated piezoelectric/electrostrictive element of the present invention, it is preferable that the outer electrode is formed on the chamfered surface (the surface which has been flatted by removing the stepped portions therefrom). Such chamfered surface does not easily come into direct contact with the side surface of the casing. Therefore, when the outer electrode is formed on this surface, the inner electrode can be prevented from being worn by the above-described stepped portion structure (i.e., a protruding structure). Moreover, even the outer electrode can be inhibited from being worn even when slid.

In the laminated piezoelectric/electrostrictive element of the present invention, the inner electrode layer is not exposed to an outer surface (of the laminated piezoelectric/electrostrictive element). The outer surface includes the above-described side surface, and means all outer surfaces of the laminated piezoelectric/electrostrictive element. In this configuration, the inner electrode layer is formed offset from an outer shape of the columnar laminate. That is, the inner electrode layers, each having an area smaller than that of each piezoelectric/electrostrictive layer, are laminated between the piezoelectric/electrostrictive layers, and the inner electrode layers cannot be visually recognized from the outside. In addition, the inner electrode layers are connected to the outer electrodes every other layer. A portion connected to the outer electrode appears on the side surface of the columnar laminate, but even in this portion, the inner electrode layer is covered with the outer electrode, and is not exposed to the outer surface of the laminated piezoelectric/electrostrictive element. It is to be noted that the inner electrode layer may be connected to via holes or the like extending through the columnar laminate (piezoelectric/electrostrictive layer) every other layer.

In the laminated piezoelectric/electrostrictive element of the present invention, it is preferable that a recessed portion is disposed in the center of at least one of two end faces of the columnar laminate which are perpendicular to the axial direction of the columnar laminate. Moreover, in the present specification, the columnar laminate includes a cylindrical laminate having a central axis portion which is hollow. In a case where the laminated piezoelectric/electrostrictive element of the present invention has such recessed portion, especially when the columnar laminate has a columnar shape, positioning of the element in the casing is facilitated.

In addition, in the present invention, in a case where the center of the laminated piezoelectric/electrostrictive element (columnar laminate) is hollow regardless of the shape, a structurally large surface area can be attained owing to a synergistic effect with a structure having the stepped portions. Therefore, it is possible to effectively release generated heat which causes energy loss during driving of the laminated piezoelectric/electrostrictive element.

The laminated piezoelectric/electrostrictive element of the present invention is preferably prepared by a green sheet laminating method or a method of punching simultaneous with laminating, but not limited thereto. That is, in the present invention, the present laminated piezoelectric/electrostrictive element is prepared by: forming an electrode pattern constituting the inner electrode layer and made of a conductive material on a green sheet constituting the piezoelectric/electrostrictive layer and mainly composed of a piezoelectric/electrostrictive material; and punching the green sheet on which the electrode pattern has been formed by use of a punching machine while laminating the green sheets on a punch of the punching machine having the punch as a laminating shaft, and firing the resultant green laminate to obtain the columnar laminate. The whole element is integrally fired. It is to be noted that details of the method of punching simultaneous with laminating accord with procedures and contents disclosed in JP-A-2002-160195.

The laminated piezoelectric/electrostrictive element of the present invention is preferably used as a driving source for opening and closing mechanism of an injection nozzle in a fuel injecting device of an internal combustion engine.

The laminated piezoelectric/electrostrictive element of the present invention is referred to as piezoelectric/electrostrictive, but the displacement generated in the piezoelectric/electrostrictive layer includes all of displacements based on strains induced by an electric field. That is, in the present invention, the laminated piezoelectric/electrostrictive element is not limited, in a narrow sense, to use of a piezoelectric effect which generates a strain substantially proportional to an applied electric field, or use of an electrostrictive effect which generates a strain substantially proportional to a square of the applied electric field. The element includes the use of phenomenon such as polarization reversal seen in a general ferroelectric material or antiferroelectric phase-ferroelectric phase transition seen in an antiferroelectric material.

The laminated piezoelectric/electrostrictive element of the present invention has the stepped portions which appear periodically at every laminating cycle, on the side surface of the columnar laminate, which is parallel to the axial direction of the columnar laminate. Therefore, in a case where the laminated piezoelectric/electrostrictive element of the present invention is housed together with the lubricant in the casing, a lubricant reservoir is formed in the stepped portions, and a lubricant cooling effect can be obtained therefrom. Since these stepped portions are provided, the element has an excellent lubricant circulating property, and the element can stably operate over a long period of time. In addition, in the laminated piezoelectric/electrostrictive element of the present invention, the structure of the element has a relatively large surface area as compared with a structure in which any stepped portion is not disposed. Therefore, it is possible to effectively release the heat generated by driving the element.

In a preferable configuration of the laminated piezoelectric/electrostrictive element of the present invention, the sectional shape of the piezoelectric/electrostrictive layer parallel to the laminating direction is trapezoidal, and the inner electrode layer is formed on the surface constituting the top (short side) of the trapezoidal shape. That is, in a case where the laminated piezoelectric/electrostrictive element of the present invention is housed in the casing and operated (expanded and contracted) therein, the inner electrode layer is not exposed to the sliding surface of the element and the casing. Therefore, the inner electrode layer is not worn, and wearing dust of a conductive material component constituting the inner electrode layer is not generated by the wearing in the casing. Therefore, the element has excellent electric reliability, and can operate stably over the long period of time.

In the preferable configuration of the laminated piezoelectric/electrostrictive element of the present invention, the inner electrode layer is not exposed to the outer surface of the element. Therefore, even if a more overhung portion of the stepped portions present on the side surface, in other words, the protruded portion constituting the protruded structure of the element is worn, the inner electrode layer is not worn. Therefore, the element has excellent electric reliability, and can operate stably over the long period.

In a preferable configuration of the present invention, the laminated piezoelectric/electrostrictive element is prepared through a manufacturing process by the green sheet laminating method, or the method of punching simultaneous with laminating. Therefore, in the preferable configuration of the laminated piezoelectric/electrostrictive element of the present invention, the stepped portions are formed with a good precision. Therefore, in the present invention, the laminated piezoelectric/electrostrictive element has a structure in which there is hardly deviation in an axial direction or a displacement (expansion and contraction) direction of the columnar laminate. The generated displacement or stress can be exerted with a good efficiency.

When the laminated piezoelectric/electrostrictive element of the present invention is adopted as the driving source for opening and closing mechanism of the injection nozzle, the fuel injecting device can realize the opening and closing of the injection nozzle at a high speed stably over the long period of time. Therefore, an optimum amount of fuel can be fed to the cylinder in accordance with an operation situation of an internal combustion engine such as a diesel engine. Therefore, the fuel injecting device adopting the laminated piezoelectric/electrostrictive element of the present invention brings about, stably over the long period of time, excellent effects that deleterious substances such as particulates, nitrogen oxide, carbon monoxide and hydrocarbon included in an exhaust gas are reduced, fuel consumption is reduced, engine noise is reduced and an engine output is improved.

BRIEF DESCRIPTION OF THE DRAWINGS

FIG. 15 is a sectional view showing a still further embodiment of the laminated piezoelectric/electrostrictive element of the present invention; and FIGS. 16(a) and 16(b) are plan views showing one configuration of a piezoelectric/electrostrictive layer and an inner electrode layer of the laminated piezoelectric/electrostrictive element shown in FIG. 15.

EXPLANATION ON NUMERICAL REFERENCES

Figure 1:
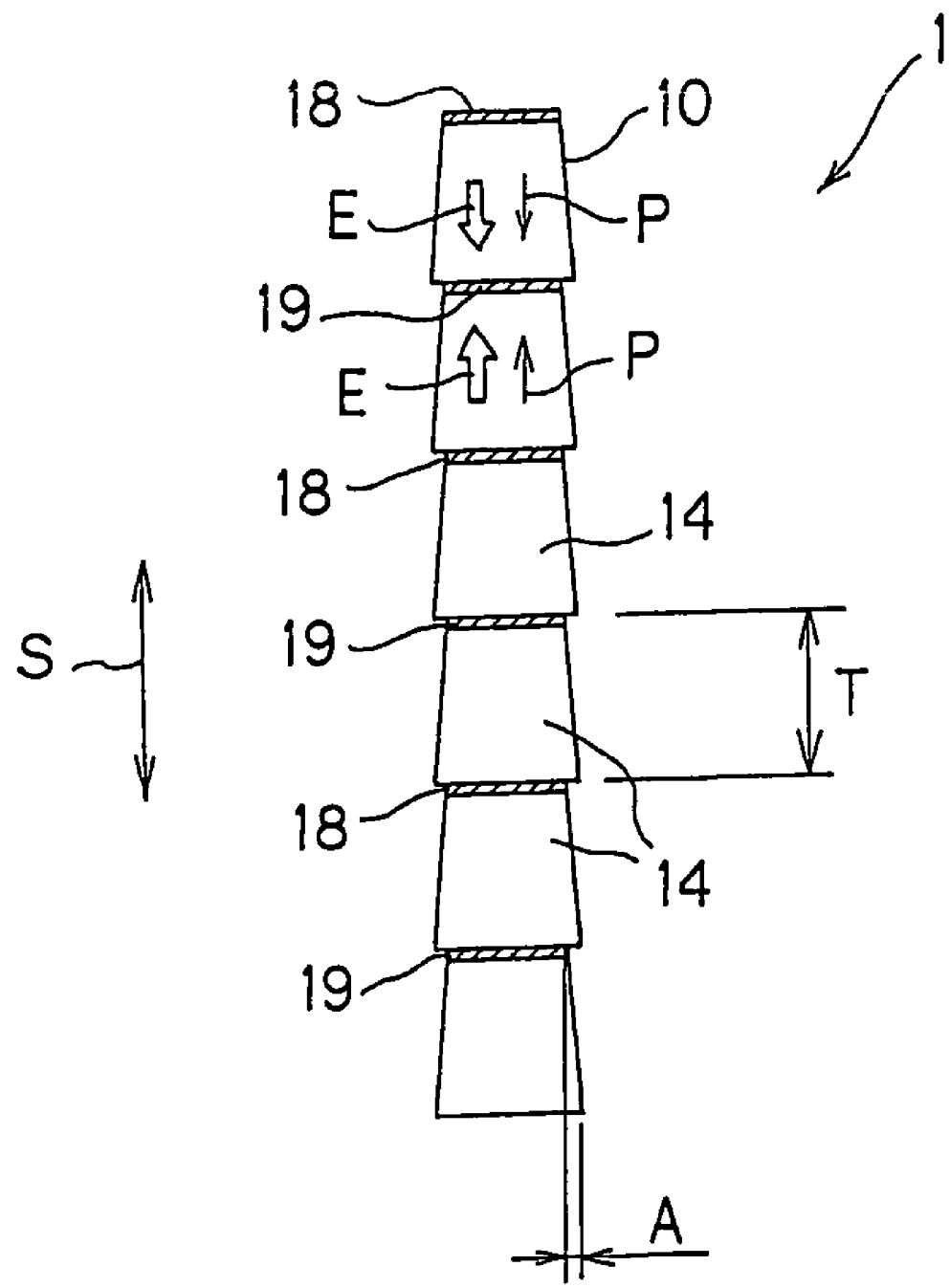
FIG. 1 is a sectional view showing an embodiment of a laminated piezoelectric/electrostrictive element of the present invention.

The following numerical references denote a part or an element as defined below:
1, 21, 31, 44, 91, 111, and 151 . . . laminated piezoelectric/electrostrictive element;
10, 20, 30, 40, 90, 110, and 150 . . . columnar laminate; 14, 114, and 214 . . . piezoelectric/electrostrictive layer; 18, 118, and 218 . . . inner electrode layers (signal electrodes);
19, 119, and 219 . . . inner electrode layers (common electrodes);
32 . . . recessed portion;
41 . . . green laminate;
42, 60, and 80 . . . fired laminate;
43, 63, and 83 . . . cut line;
48 . . . conductor film;
51, 61, and 81 . . . solid portion;
52, 62, and 82 . . . void portion; and
128, and 228 . . . outer electrodes.

DESCRIPTION OF THE PREFERRED EMBODIMENTS

Embodiments of the present invention will be described hereinafter appropriately with reference to the drawings, but the present invention should not be limited to these embodiments in any means. The present invention can variously be changed, modified, improved or replaced based on knowledge of any person skilled in the art without departing from the scope of the present invention. For example, the drawings show preferable embodiments of the present invention, but the present invention is not limited to configurations or information shown in the drawings. To implement or verify the present invention, means similar or equivalent to those described in the present specification can be applied, but preferable means are the following means.

FIG. 1 is a sectional view showing one embodiment of a laminated piezoelectric/electrostrictive element of the present invention. As shown in FIG. 1, a laminated piezoelectric/electrostrictive element 1 has: a columnar laminate 10 constituted by alternately laminating a plurality of piezoelectric/electrostrictive layers 14, inner electrode layers 18 and 19; and outer electrodes (not shown) connected to the inner electrode layers 18 and 19 every other layer. The columnar laminate 10 substantially has a columnar shape as a whole. Each outer electrode connects the inner electrode layers 18 (signal electrodes) to each other or the inner electrode layers 19 (common electrodes) to each other, and has a function of a wiring line to apply a voltage between the inner electrode layers 18 and 19 by use of an external power supply. The columnar laminate 10 constituted of the piezoelectric/electrostrictive layers 14 and the inner electrode layers 18 and 19 is fired integrally with the outer electrodes.

In the laminated piezoelectric/electrostrictive element 1, a polarizing direction P (see FIG. 1) of each piezoelectric/electrostrictive layer 14 is directed from the signal electrode (inner electrode layer 18) to the common electrode (inner electrode layer 19). Moreover, when the voltage is applied in the same direction E as the polarizing direction P (see FIG. 1) between the signal electrode and the common electrode (i.e., to the piezoelectric/electrostrictive layer 14), such displacement is generated that each of the piezoelectric/electrostrictive layers 14 extends in an axial direction (direction (referred to as S-direction) shown by an arrow S in the drawing) of the columnar laminate 10, and the laminated piezoelectric/electrostrictive element 1 extends. When any voltage is not applied, and any electric field is not formed in the piezoelectric/electrostrictive layer 14, each of the piezoelectric/electrostrictive layers 14 contracts. This contracts the laminated piezoelectric/electrostrictive element 1.

In the laminated piezoelectric/electrostrictive element 1, as clearly shown in FIG. 1, a section of each piezoelectric/electrostrictive layer 14 parallel to the laminating direction (the same direction as the S-direction) has a trapezoidal shape, and the inner electrode layer 18 or 19 is formed on the surface of the layer constituting the top (short side) of the trapezoidal shape. A side surface of the columnar laminate 10 parallel to the axial direction (the same direction as the S-direction) of the columnar laminate 10 has a plurality of stepped portions A being formed periodically at every laminating cycle T.

A size (length) of each laminating period T corresponds to a thickness of the piezoelectric/electrostrictive layer 14 and the inner electrode layer 18 (19), and is of the order of several tens to hundreds of micrometers. A dimension of each stepped portion A is preferably 1 to 8 µm, more preferably 1 to 6 µm, further preferably 1 to 4 µm. In a case where the dimension of the stepped portion A is above 10 µm, when the laminated piezoelectric/electrostrictive element 1 contained together with a lubricant in a casing is used as a driving source of an injection nozzle opening and closing mechanism in a fuel injecting device, an effect of a function of circulating and cooling the lubricant is not easily obtained, and it is not preferable that a strength of the element as a structure might degrade.

The laminated piezoelectric/electrostrictive element 1 is prepared using a green sheet laminating method, or a method of punching simultaneous with laminating in order to precisely and easily obtain each trapezoidal section and each stepped portion A (the manufacturing method will be described later). That is, an electrode pattern made of a conductive material and constituting the inner electrode layer 18 or 19 is formed on a green sheet made of mainly a piezoelectric/electrostrictive material and constituting the piezoelectric/electrostrictive layer 14. The green sheet on which the electrode pattern has been formed is punched using a punching machine while laminating the sheet on a punch of the punching machine as a laminating shaft. The resultant green laminate is fired to obtain the columnar laminate 10, thereby preparing the element.

In a case where the laminated piezoelectric/electrostrictive element 1 is prepared using the green sheet laminating method, the sectional shape (trapezoidal shape) of each piezoelectric/electrostrictive layer 14 of the element can be adjusted (changed) by a composition of the green sheet and a clearance between a punch of the punching machine for use in the punching and a die. The clearance between the punch and the die is preferably 1 to 8 µm, more preferably 1 to 4 µm. When this clearance is set to this range, it is possible to steadily obtain each piezoelectric/electrostrictive layer 14 preferably having a trapezoidal shape.

Moreover, examples of a raw material of the green sheet include an organic binder, a solvent, a dispersant and a plasticizer in addition to the piezoelectric/electrostrictive material (powder). Among the materials, the organic binder material is mixed at a ratio of preferably 4 to 9 mass %, more preferably 5 to 6 mass % with respect to the piezoelectric/electrostrictive material. When the organic binder is mixed with the raw material in such range, a strength required for breaking the material during the punching becomes appropriate, the sectional shape of the piezoelectric/electrostrictive layer 14 obtained by the punching is stabilized, and all of the piezoelectric/electrostrictive layers 14 obtain uniform trapezoidal shapes.

FIG. 15 is a sectional view showing another embodiment of the laminated piezoelectric/electrostrictive element of the present invention. FIGS. 16A and 16B are plan views showing one configuration of a piezoelectric/electrostrictive layer and an inner electrode layer of a laminated piezoelectric/electrostrictive element 151 shown in FIG. 15. The laminated piezoelectric/electrostrictive element 151 has: a columnar laminate 150 constituted by alternately laminating piezoelectric/electrostrictive layers 14 and inner electrode layers 18 and 19; and outer electrodes (not shown) connected to the inner electrode layers 18 and 19 every other layer. This laminated piezoelectric/electrostrictive element 151 has a nearly trapezoidal sectional shape parallel to a direction in which the piezoelectric/electrostrictive layers 14 are laminated. A side surface of the columnar laminate 150 parallel to an axial direction of the columnar laminate 150 has stepped portions slightly larger at every laminating cycle, compared with the laminated piezoelectric/electrostrictive element 1.

In the laminated piezoelectric/electrostrictive element 151, the inner electrode layer 18 or 19 is not formed on a surface constituting a top (short side) of the uppermost piezoelectric/electrostrictive layer 14 among the trapezoidal piezoelectric/electrostrictive layers 14. The inner electrode layer 18 or 19 has an area which is smaller than that of each piezoelectric/electrostrictive layer 14, and is formed with an offset from an outer shape of the columnar laminate 150 (see FIGS. 16(a) and 16(b)). Therefore, the inner electrode layer 18 or 19 except a portion to be connected to the outer electrode is not exposed on an outer surface (side surface) of the columnar laminate 150, and all of the inner electrode layer is not exposed on an outer surface (side surface) of the laminated piezoelectric/electrostrictive element 151. Therefore, the inner electrode layer 18 or 19 cannot be visually recognized from the outside. The laminated piezoelectric/electrostrictive element 151 is different from the laminated piezoelectric/electrostrictive element 1 in these respects, but other structure and specifications of the laminated piezoelectric/electrostrictive element 151 are similar to those of the above laminated piezoelectric/electrostrictive element 1.

Figure 2:
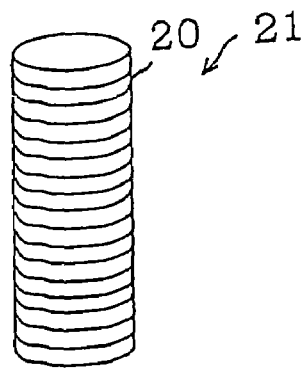
FIG. 2 is a perspective view showing another embodiment of the laminated piezoelectric/electrostrictive element of the present invention.
Figure 7:
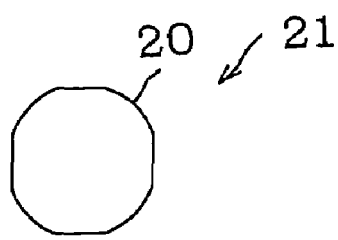
FIG. 7 is a sectional view of a columnar laminate showing a section of the laminated piezoelectric/electrostrictive element shown in FIG. 2, the section being perpendicular to a laminating direction.

FIG. 2 is a perspective view showing still another embodiment of the laminated piezoelectric/electrostrictive element of the present invention, and showing a preferable example of a shape of a columnar laminate (stepped portions are omitted). Moreover, FIG. 7 is a diagram showing a shape of a section of the columnar laminate, perpendicular to a laminating direction, in the laminated piezoelectric/electrostrictive element shown in FIG. 2. In a laminated piezoelectric/electrostrictive element 21 shown in FIGS. 2 and 7, a columnar laminate 20 has a columnar shape in which four portions of a side surface are chamfered.

Figure 3:
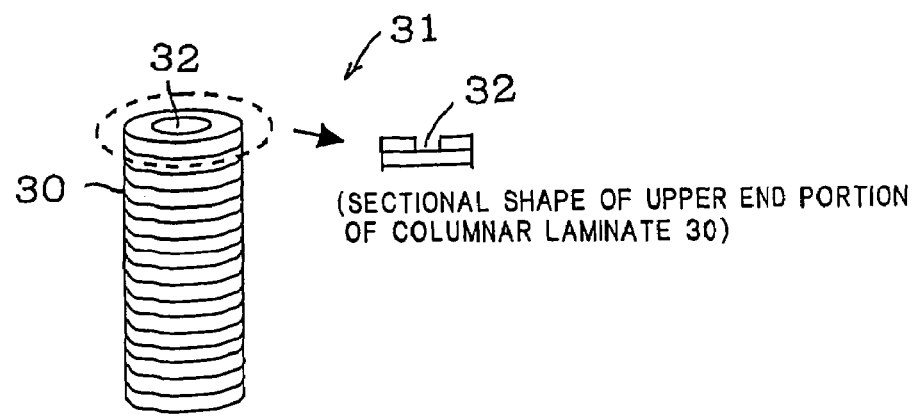
FIG. 3 is a perspective view showing still another embodiment of the laminated piezoelectric/electrostrictive element of the present invention.

FIG. 3 is a perspective view showing still another embodiment of the laminated piezoelectric/electrostrictive element of the present invention (stepped portions are omitted). In a laminated piezoelectric/electrostrictive element 31 shown in FIG. 3, a columnar laminate 30 has a columnar shape in which four portions of a side surface are chamfered in the same manner as in the columnar laminate 20 of the laminated piezoelectric/electrostrictive element 21. However, the columnar laminate 30 is different from the columnar laminate 20 in that a recessed portion 32 is formed in the center of an upper end face (as viewed in the drawing) among two end faces perpendicular to an axial direction of the columnar laminate (in FIG. 3, a sectional shape of an upper end portion shown by an arrow is a sectional shape of a portion of the columnar laminate 30 surrounded with a dotted line). In the laminated piezoelectric/electrostrictive element of the present invention, as another preferable shape of the columnar laminate, there is a pillar shape obtained by chamfering corner portions of a side surface (see FIG. 4(e) described later). It is to be noted that an outer electrode is formed on a chamfered surface. When the electrode is formed, C-chamfering is preferable.

Figure 10:
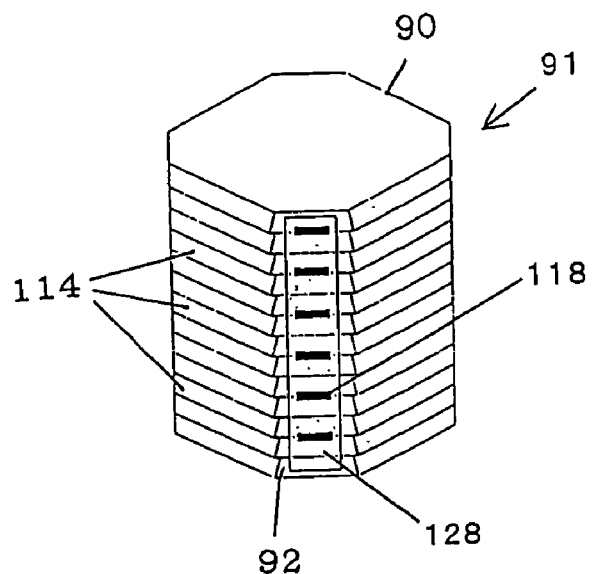
FIG. 10 is a perspective view showing a further embodiment of the laminated piezoelectric/electrostrictive element of the present invention.
Figure 11A:
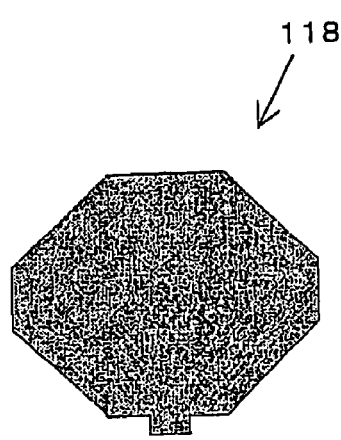
FIGS. 11(a) and 11(b) are plan views showing one configuration of an inner electrode layer of the laminated piezoelectric/electrostrictive element shown in FIG. 10.
Figure 11B:
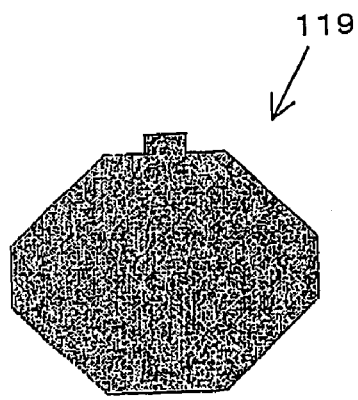

FIG. 10 is a perspective view showing a further embodiment of the laminated piezoelectric/electrostrictive element of the present invention. Moreover, FIGS. 11(a) and 11(b) are plan views showing one configuration of an inner electrode layer of a laminated piezoelectric/electrostrictive element 91 shown in FIG. 10. The laminated piezoelectric/electrostrictive element 91 has a columnar laminate 90 constituted by alternately laminating a plurality of piezoelectric/electrostrictive layers 114 and inner electrode layers, and stepped portions are disposed on a side surface of the columnar laminate 90. The inner electrode layers are constituted of an inner electrode layer 118 and an inner electrode layer which is not shown in FIG. 10 (referred to as an inner electrode layer 119, see FIG. 11(b)) every other layer. The columnar laminate 90 has a pillar shape formed by chamfering a side surface. An outer electrode 128 is formed on a chamfered surface 92, which connects the inner electrode layers 118 laminated every other layer to each other. On an inner side (back-surface side) which is not clearly shown in FIG. 10, an outer electrode (referred to as an outer electrode 129: not depicted) is formed on a chamfered surface in the same manner as in the outer electrode 128, the outer electrode connecting the inner electrode layers 119 laminated every other layer to each other as not clearly shown in FIG. 10. As shown in FIGS. 11(a) and 11(b), the inner electrode layers 118 and 119 of the laminated piezoelectric/electrostrictive element 91 have such shapes as to sandwich substantially the whole surface of each piezoelectric/electrostrictive layer 114 therebetween. However, to prevent short-circuit, a part of the shape of the inner electrode layer is cut with respect to the shape of the piezoelectric/electrostrictive layer 114. Cut portions correspond to upper and lower portions of the inner electrode layers 118 and 119 shown in FIGS. 11(a) and 11(b), respectively. Moreover, on the chamfered surface 92 (the surface provided with the outer electrode 128) shown on a front side of FIG. 10, the only inner electrode layers 118 are exposed and connected to the outer electrode 128. The inner electrode layers 119 are not exposed, and are insulated from the outer electrode 128 by the piezoelectric/electrostrictive layers 114. On the other hand, although not clearly shown, on the chamfered surface (the surface provided with the outer electrode 129) on the inner side of FIG. 10, the only inner electrode layers 119 are exposed and connected to the outer electrode 129. The inner electrode layers 118 are not exposed, and are insulated from the outer electrode 129 by the piezoelectric/electrostrictive layers 114.

Figure 12:
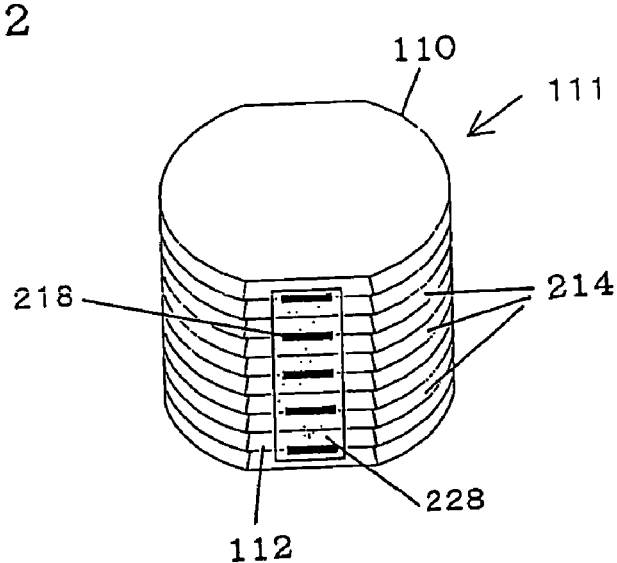
FIG. 12 is a perspective view showing a further embodiment of the laminated piezoelectric/electrostrictive element of the present invention.
Figure 13A:
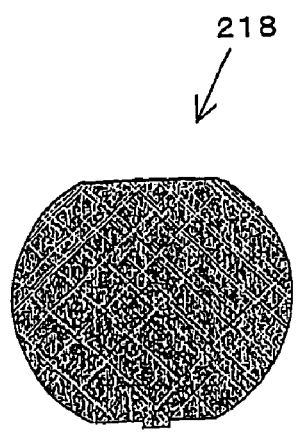
FIGS. 13(a) and 13(b) are plan views showing one configuration of an inner electrode layer of the laminated piezoelectric/electrostrictive element shown in FIG. 12.
Figure 13B:
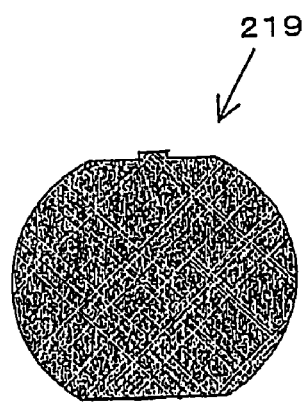

FIG. 12 is a perspective view showing a further embodiment of the laminated piezoelectric/electrostrictive element of the present invention. Moreover, FIGS. 13(a) and 13(b) are plan views showing one configuration of an inner electrode layer of a laminated piezoelectric/electrostrictive element 111 shown in FIG. 12. The laminated piezoelectric/electrostrictive element 111 has a columnar laminate 110 constituted by alternately laminating a plurality of piezoelectric/electrostrictive layers 214 and inner electrode layers, and stepped portions are disposed on a side surface of the columnar laminate 110. The inner electrode layers are constituted of an inner electrode layer 218 and an inner electrode layer which is not shown in FIG. 12 (referred to as an inner electrode layer 219, see FIG. 13(b)) every other layer. The columnar laminate 110 has a columnar shape formed by chamfering a side surface. An outer electrode 228 is formed on a chamfered surface 112, which connects the inner electrode layers 218 laminated every other layer to each other. On an inner side (back-surface side) which is not clearly shown in FIG. 12, an outer electrode (referred to as an outer electrode 229: not depicted) is formed on a chamfered surface in the same manner as in the outer electrode 228, the outer electrode connecting the inner electrode layers 219 laminated every other layer to each other as not clearly shown in FIG. 12. As shown in FIGS. 13(a) and 13(b), the inner electrode layers 218 and 219 of the laminated piezoelectric/electrostrictive element 111 have such shapes as to sandwich substantially the whole surface of each piezoelectric/electrostrictive layer 214 therebetween. However, to prevent short-circuit, a part of the shape of the inner electrode layer is cut with respect to the shape of the piezoelectric/electrostrictive layer 214. Cut portions correspond to upper and lower portions of the inner electrode layers 218 and 219 shown in FIGS. 13(a) and 13(b), respectively. Moreover, on the chamfered surface 112 (the surface provided with the outer electrode 228) shown on a front side of FIG. 12, the only inner electrode layers 218 are exposed and connected to the outer electrode 228. The inner electrode layers 219 are not exposed, and are insulated from the outer electrode 228 by the piezoelectric/electrostrictive layers 214. On the other hand, although not clearly shown, on the chamfered surface (the surface provided with the outer electrode 229) on the inner side of FIG. 12, the only inner electrode layers 219 are exposed and connected to the outer electrode 229. The inner electrode layers 218 are not exposed, and are insulated from the outer electrode 229 by the piezoelectric/electrostrictive layers 214.

Figure 4:
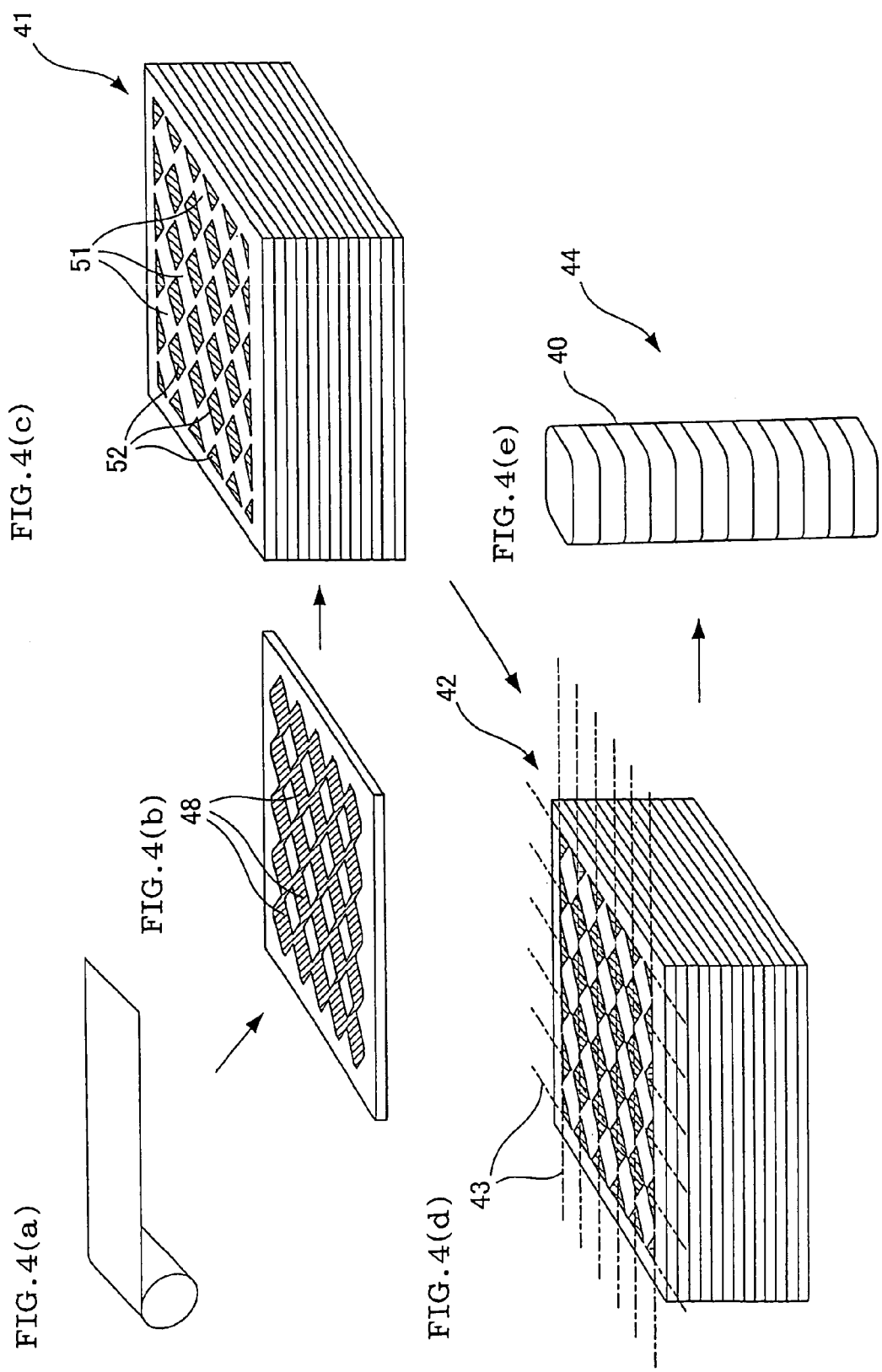
FIGS. 4(a) to 4(e) are explanatory views showing one example of steps of manufacturing the laminated piezoelectric/electrostrictive element of the present invention.

Next, there will be described a method of manufacturing the laminated piezoelectric/electrostrictive element of the present invention, and a material for use. FIGS. 4(*a*) to 4(*e*) are explanatory views showing one example of steps of manufacturing the laminated piezoelectric/electrostrictive element of the present invention. To manufacture the laminated piezoelectric/electrostrictive element of the present invention, it is preferable to utilize a green sheet laminating method or a method of punching simultaneous with laminating, and these two methods are used in the manufacturing method described hereinafter.

First, there are prepared the predetermined number of ceramic-made green sheets mainly composed of a piezoelectric/electrostrictive material (hereinafter referred to as ceramic green sheets or simply as sheets). This ceramic green sheet constitutes later a piezoelectric/electrostrictive layer. The ceramic green sheet can be prepared by a conventional known ceramic manufacturing method. For example, powder of the piezoelectric/electrostrictive material is prepared, and the powder is mixed with an organic resin (binder), a solvent, a dispersant, a plasticizer or the like to obtain a desired composition, thereby preparing slurry. After a defoaming treatment, the slurry is subjected to the forming process by utilizing a tape forming process such as a doctor blade process, a reverse roll coater process or a reverse doctor roll coater process (see FIG. 4(*a*)). The resultant formed material can appropriately be cut to prepare the sheet.

There is not any restriction on the piezoelectric/electrostrictive material as long as an electric field induced strain is caused. The material may be crystalline or amorphous, or a semiconductor ceramic material, a ferroelectric ceramic material or an antiferroelectric ceramic material may be used. The material may appropriately be selected and adopted in accordance with an application. Alternatively, the material may or may not require a polarization treatment.

Typical examples of a preferable material include: lead zirconate; lead titanate; lead magnesium niobate; lead nickel niobate; lead nickel tantalate; lead zinc niobate; lead manganese niobate; lead antimony stannate; lead cobalt niobate; lead magnesium tungstate; lead magnesium tantalate; barium titanate; sodium bismuth titanate; bismuth neodymium titanate (BNT); sodium niobate; potassium sodium niobate; strontium bismuth tantalate; copper tungsten barium; bismuth ferrate; and a complex oxide made of two or more of them. Moreover, in the material, there may exist, in the form of solid solution, an oxide such as the oxide of lanthanum, calcium, strontium, molybdenum, tungsten, barium, niobium, zinc, nickel, manganese, cerium, cadmium, chromium, cobalt, antimony, iron, yttrium, tantalum, lithium, bismuth, tin or copper. Above all, a preferable material is: a material containing a complex oxide of lead zirconate, lead titanate and lead magnesium niobate as a main component and containing nickel oxide; or a material containing a complex oxide of lead zirconate, lead titanate, lead magnesium niobate or lead nickel niobate as a main component, because a large electric field induced strain can be utilized. In this case, it is especially preferable that the material contains 0.05 to 3 mass % of a nickel component in terms of an oxide. Alternatively, it is preferable that lithium bismuthate, lead germanate or the like is added to the above-described material, because a high material characteristic can be developed while realizing firing of the piezoelectric/electrostrictive layer at a low temperature. An especially preferable material is: the material containing the complex oxide of lead zirconate, lead titanate and lead magnesium niobate as the main component and containing nickel oxide; or the material containing the complex oxide of lead zirconate, lead titanate, lead magnesium niobate and lead nickel niobate as the main component, the material containing 0.05 to 3 mass % of the nickel component in terms of the oxide, to which 0.3 to 4 mass % of lead germanate has been added.

Next, after the predetermined number of the sheets are prepared, a conductor film 48 having a predetermined pattern (electrode pattern) is formed on the surface of each sheet by use of a conductive material (see FIG. 4(*b*)). This conductor film 48 constitutes later an inner electrode layer (a signal electrode and a common electrode).

As means for forming the conductor film, a screen printing process is preferably used, but means such as photolithography, transfer or stamping may be utilized. As the conductive material for use, one may adopt a metal which is a solid at room temperature. It is preferable to use: a single metal such as aluminum, titanium, chromium, iron, cobalt, nickel, copper, zinc, niobium, molybdenum, ruthenium, palladium, rhodium, silver, tin, tantalum, tungsten, iridium, platinum, gold or lead; or an alloy made of two or more of them. It is preferable to use, for example, an alloy alone such as silver-platinum, platinum-palladium or silver-palladium, or a combination of two or more alloys. The material may be mixed with aluminum oxide, zirconium oxide, titanium oxide, silicon oxide, cerium oxide, glass, the piezoelectric/electrostrictive material or the like, or cermet may be used. The material is selected from then depending on whether or not the material is to be fired simultaneously with the piezoelectric/electrostrictive layer. Since the inner electrode layer is fired simultaneously with the piezoelectric/electrostrictive layer, it is necessary to use a metal having a high-melting point such as platinum, palladium, a platinum-palladium alloy or a silver-palladium alloy, which does not change even at a firing temperature of the piezoelectric/electrostrictive layer. On the other hand, since the conductor film constituting later an outer electrode as described later can be fired at a low temperature, aluminum, gold, silver, the silver-palladium alloy or the like may be used. In addition, a very large displacement has to be sometimes generated in accordance with the application. In such case, a foil, a plate or the like of a conductive material having an excellent ductility may be separately disposed on the formed electrode so as to prevent the outer electrode from being disconnected.

Next, there are punched the predetermined number of the sheets on which the conductor films 48 constituting later the inner electrode layers are formed. The punching is performed using a punching machine in which the clearance between the punch and the die is appropriately adjusted as described above, while laminating the worked sheets on the punch which is regarded as a laminating shaft. These sheets are laminated and attached to one another under pressure to obtain a green laminate 41 (see FIG. 4(*c*)). Since void portions 52 are formed in the sheets during the punching, the green laminate 41 is constituted as a sheet laminate in which substantially quadrangular solid portions 51 are left. Thereafter, the green laminate 41 is fired, and an integrated fired laminate 42 is obtained. The resultant fired laminate is cut along cut lines 43 by processing means such as dicing, slicing or wire sawing, and further unnecessary portions are removed (see FIG. 4(*d*)). It is to be noted that the cutting may be performed before the firing. The number of steps of handling the components increases, but time required for degreasing and firing can be shortened.

The above-described processing will give an individually divided columnar laminate 40 constituted by alternately laminating the piezoelectric/electrostrictive layers and the inner electrode layers. Further on a side surface (the surface formed by the processing) of the columnar laminate 40, which is parallel to an axial direction of the laminate, the conductor film is formed and fired to form an outer electrode (not shown). Accordingly, a laminated piezoelectric/electrostrictive element 44 can be obtained (see FIG. 4(*e*), stepped portions are omitted). That is, according to the method of manufacturing the laminated piezoelectric/electrostrictive element of the present invention, the laminated piezoelectric/electrostrictive element of the present invention can be prepared by necessary, but minimum processing. The processing itself is performed for both of a purpose of individually dividing the laminate and a purpose of obtaining a flat surface for forming the outer electrode. Further for a purpose of enhancing a moisture-resistant property and an insulating property of the laminated piezoelectric/electrostrictive element, a resin coating may be applied. Examples of a resin material for use in the resin coating include a polyfluoroethylene-based material, an acrylic material, an epoxy-based material, a polyimide-based material and a silicone material. It is preferable to use the polyfluoroethylene-based material, the polyimide-based material or a composite material such as a composite material of the polyfluoroethylene (PTFE)-based material and polyamide imide under a high environmental load of the fuel injecting device or the like.

Figure 5:
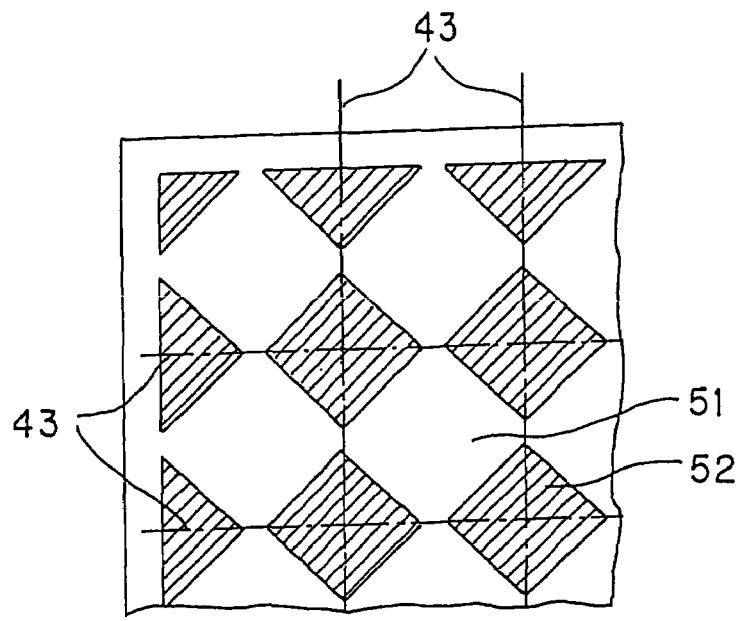
FIG. 5 is a partially enlarged plan view showing a top of a fired laminate shown in FIG. 4(d)

FIG. 5 is diagram showing a partially enlarged top of the fired laminate 42 shown in FIG. 4(*d*). As described above, to obtain the green laminate 41 before fired, the sheets have already been punched to form the void portions 52, and the green laminate 41 has a constitution in which a plurality of solid portions 51 are connected to one another. Therefore, even the fired laminate 42 obtained by integrally firing the green laminate has the void portions 52, and the fired laminate is constituted so that a plurality of substantially quadrangular (substantially square pole shape as a whole) solid portions 51 are connected to one another as viewed from the top. Moreover, the fired laminate 42 is further worked along the cut lines 43. In the resultant laminated piezoelectric/electrostrictive element 44, the columnar laminate 40 has a square pole shape obtained by chamfering corner portions of the side surface of the columnar laminate (see FIG. 4(*e*)). That is, the above-described method of manufacturing the laminated piezoelectric/electrostrictive element of the present invention is a manufacturing method in which a near net shape of a final product is obtained. Therefore, as described above, it is possible to minimize post-processing which is a cause for increasing labor hours and costs. Moreover, it is possible to prepare (form) the laminated piezoelectric/electrostrictive element having any complicated shape and structure as long as the shape can two-dimensionally be worked.

Figure 6:
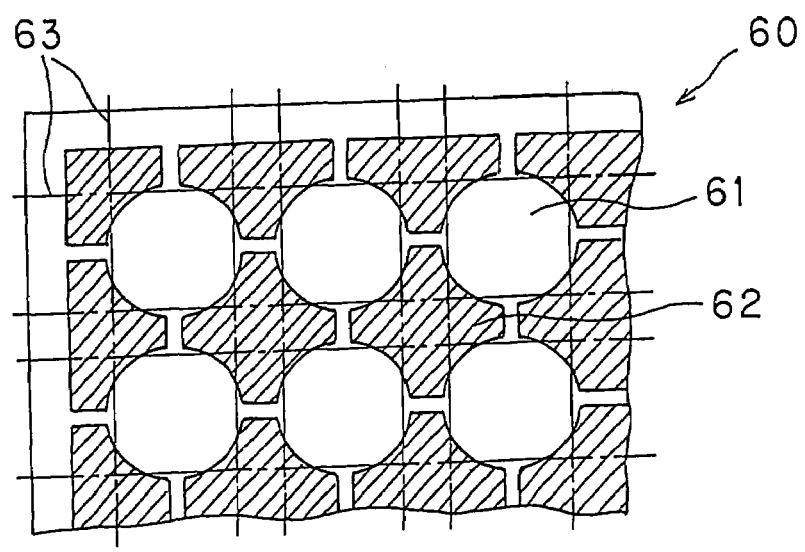
FIG. 6 is a partially enlarged plan view showing a fired laminate in a manufacturing process in a further embodiment of the laminated piezoelectric/electrostrictive element of the present invention.

FIG. 6 is a diagram corresponding to FIG. 5, showing another configuration. It is a plan view showing a partially enlarged top of the fired laminate in a process of preparing the laminated piezoelectric/electrostrictive element having a columnar laminate obtained by chamfering four portions of the side surface of the laminate. As shown by the partially enlarged top of a fired laminate 60 in FIG. 6, to obtain a green laminate before fired, the laminate has already been punched to form void portions 62, and the columnar laminate is constituted so that a plurality of substantially circular (substantially columnar shape as a whole) solid portions 61 are connected to one another as viewed from the top. In the laminated piezoelectric/electrostrictive element obtained by processing this fired laminate 60 along cut lines 63, the columnar laminate has a columnar shape formed by chamfering four portions in the same manner as in the laminated piezoelectric/electrostrictive element 21 shown in FIGS. 2 and 7.

Figure 8:
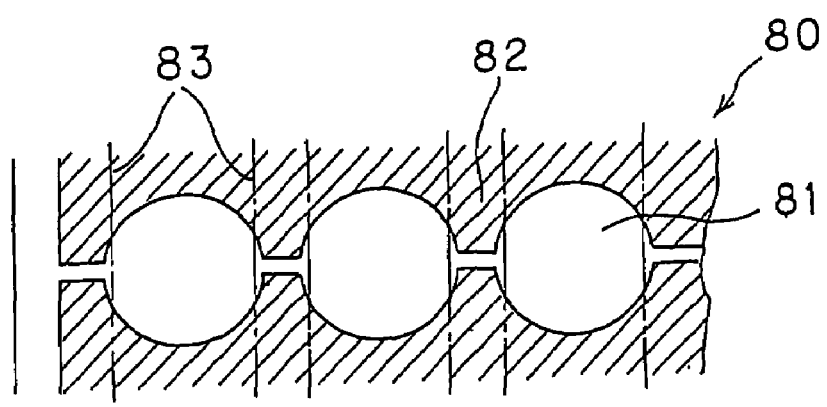
FIG. 8 is a partially enlarged plan view of a fired laminate in a manufacturing process in a further embodiment of the laminated piezoelectric/electrostrictive element of the present invention.
Figure 9:
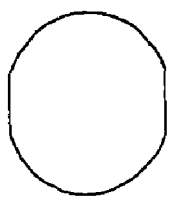
FIG. 9 is a sectional view of a columnar laminate showing a section perpendicular to a laminating direction in a further embodiment of the laminated piezoelectric/electrostrictive element of the present invention.

FIG. 8 is a diagram corresponding to FIG. 5, showing still another configuration. It is a plan view showing a partially enlarged top of a fired laminate in a process of preparing a laminated piezoelectric/electrostrictive element having a columnar laminate obtained by chamfering two portions of a side surface of the laminate. Moreover, FIG. 9 is a diagram of the columnar laminate of the laminated piezoelectric/electrostrictive element including the columnar laminate having a columnar shape formed by chamfering two portions. It shows a section of the columnar laminate, which is perpendicular to a laminating direction. As shown by the partially enlarged top of a fired laminate 80 in FIG. 8, to obtain a green laminate before fired, the laminate has already been punched to form void portions 82. The fired laminate is constituted so that a plurality of substantially circular (substantially columnar shape as a whole) solid portions 81 are connected to one another as viewed from the top. In the laminated piezoelectric/electrostrictive element obtained by processing this fired laminate 80 along cut lines 83, the columnar laminate has a columnar shape formed by chamfering two portions as shown by the section of FIG. 9.

In the above-described manufacturing method, to obtain the green laminate (see FIG. 4(*c*)), the sheets are punched while laminating the worked sheets on the punch of the punching machine including the punch as the laminating shaft. Therefore, the sheets can be positioned with a good precision. This method is referred to as a method of punching simultaneous with laminating. This method is performed in accordance with a method disclosed in JP-A-2002-160195 in which one may find detailed description on the preparation, procedure and the like as described above. When the laminated piezoelectric/electrostrictive element is manufactured using the method of punching simultaneous with laminating, any laminating deviation is not generated. Therefore, in the fired columnar laminate, a contour degree of the surface profile of the piezoelectric/electrostrictive layer can approximately be kept to the level of 8 µm or less. Therefore, unlike the conventional laminated piezoelectric element (sintered article), an outer surface of the element does not have to be finished by machining. It is easy to exert a displacement or a generated force with an intended amount in an intended direction, and characteristics of the laminated piezoelectric/electrostrictive element can efficiently be utilized. Since the contour degree of the surface profile is high, the laminated piezoelectric/electrostrictive element indicates a high resistance to a reaction generated by an operation such as pushing or striking of a certain object by the element. Damages such as breaks or cracks are not easily generated. There is produced a synergistic effect with an effect based on the element's trapezoidal sectional shape parallel to a direction in which the piezoelectric/electrostrictive layers and the inner electrode layers are laminated. Therefore, stable expansion, contraction and displacement can be developed over a long period to realize a driving operation. It is to be noted that the contour degree of the surface profile is described in Japanese Industrial Standards B0621 "Definition and Display of Geometric Deviation". The surface contour indicates a surface designated so as to have a functionally determined shape, and the contour degree of the surface profile indicates a magnitude of deviation of the surface contour from a geometric contour determined by a theoretically correct dimension.

It is to be noted that in the present invention, the laminated piezoelectric/electrostrictive element can be manufactured even without adopting the method of punching simultaneous with laminating. As a method of positioning the sheets during the laminating, for example, the sheets are successively superimposed in a frame having substantially the same inner shape as an outer shape of each sheet, or the sheets are successively superimposed through guide holes made beforehand by setting guide pins in the sheets. Alternatively, the predetermined number of guide pins each having the same shape as a punching shape are arranged at a predetermined pitch, and the sheets may successively be passed through the guide pins by use of punched holes themselves as guide holes, superimposed and positioned. After positioning and laminating the sheets, the sheets are heated and attached to one another under pressure so that the green laminate is obtained.

Figure 14:
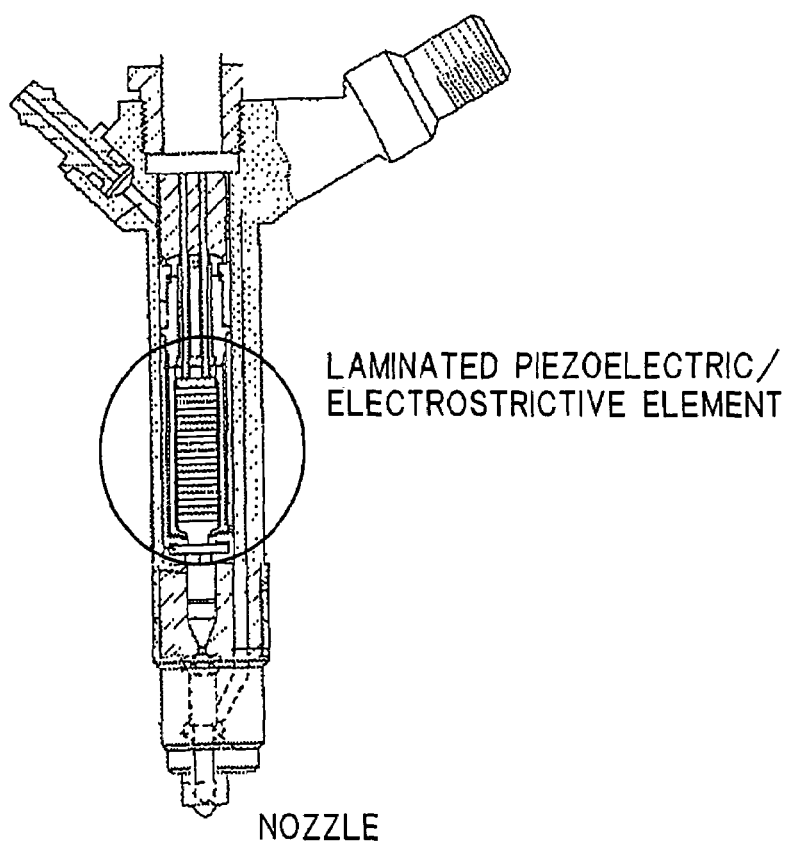
FIG. 14 is a sectional view showing one example of a fuel injecting device.

There have been described above the laminated piezoelectric/electrostrictive element and the method of manufacturing the element of the present invention. The laminated piezoelectric/electrostrictive element of the present invention is used as a driving source suitable for the injection nozzle opening and closing mechanism of the fuel injecting device. Here, FIG. 14 shows one example of the fuel injecting device. FIG. 14 is a sectional view. A high-pressure fuel enters the fuel injecting device from a common rail (not shown in FIG. 14) via a fuel inlet, and is injected from the nozzle into an engine cylinder (not shown in FIG. 14). The laminated piezoelectric/electrostrictive element is housed in a portion of the fuel injecting device surrounded with a circle shown in FIG. 14. The expansion, contraction and displacement of the element move, for example, a needle valve to open and close the nozzle, and the injecting of the high-pressure fuel is controlled. As described above, the laminated piezoelectric/electrostrictive element of the present invention can stably realize the high-speed opening and closing of the injection nozzle over a long period, and can feed an optimum amount of fuel into the cylinder. Therefore, the fuel injecting device utilizing the laminated piezoelectric/electrostrictive element of the present invention can reduce deleterious substances such as particulates included in a gas discharged from an engine stably over the long period.

A laminated piezoelectric/electrostrictive element of the present invention is preferably utilized as a driving source of an injection nozzle opening and closing mechanism in a fuel injecting device of an internal combustion engine such as a gasoline engine or a diesel engine. Moreover, the element is applied as a driving source of a device such as an optical device requiring precise positioning or a vibration preventing device.

What is claimed is:

1. A laminated piezoelectric/electrostrictive element comprising:
   a columnar laminate constituted by alternately laminating a plurality of piezoelectric/electrostrictive layers and inner electrode layers; and
   outer electrodes connected to the inner electrode layers every other layer,
   the element having a plurality of stepped portions formed periodically at every laminating cycle in a side surface of the columnar laminate of the element, the side surface being parallel to an axial direction of the columnar laminate, wherein the plurality of stepped portions are exposed in an outer surface of the piezoelectric/electrostrictive element.

2. The laminated piezoelectric/electrostrictive element according to claim 1, wherein a shape of a section of the piezoelectric/electrostrictive layer is trapezoidal which is parallel to a laminating direction, and the inner electrode layer is formed on the surface of the piezoelectric/electrostrictive layer constituting a top (short side) of the trapezoidal shape.

3. The laminated piezoelectric/electrostrictive element according to claim 1, wherein the columnar laminate has a columnar shape or a pillar shape formed by chamfering the side surface of the columnar laminate.

4. The laminated piezoelectric/electrostrictive element according to claim 2, wherein the columnar laminate has a columnar shape or a pillar shape formed by chamfering the side surface of the columnar laminate.

5. The laminated piezoelectric/electrostuictive element according to claim 3, wherein the outer electrode is formed on the chamfered surface.

6. The laminated piezoelectric/electrostrictive element according to claim 4, wherein the outer electrode is formed on the chamfered surface.

7. The laminated piezoelectric/electrostrictive element according to claim 1, wherein the inner electrode layer is not exposed on an outer surface of the element.

8. The laminated piezoelectric/electrostrictive element according to claim 1, wherein a recessed portion is provided in the center of at least one of two end faces of the columnar laminate which are perpendicular to the axial direction of the columnar laminate.

9. The laminated piezoelectric/electrostrictive element according to claim 1, which is prepared by:
   forming an electrode pattern constituting the inner electrode layer and made of a conductive material on a green sheet constituting the piezoelectric/electrostrictive layer and mainly composed of a piezoelectric!electrostrictive material; and
   punching the green sheet on which the electrode pattern has been formed by use of a punching machine while laminating the green sheets on a punch of the punching machine having the punch as a laminating shaft, and firing the resultant green laminate to obtain the columnar laminate, the whole laminated piezoelectric/electrostrictive element being integrally fired.

10. The laminated piezoelectric/electrostrictive element according to claim 1, for use as a driving source of an injection nozzle opening and closing mechanism in a fuel injecting device of an internal combustion engine.

* * * * *